United States Patent [19]

Ichimura

[11] Patent Number: 5,140,182

[45] Date of Patent: Aug. 18, 1992

[54] PLURAL STAGE VOLTAGE BOOSTER CIRCUIT WITH EFFICIENT ELECTRIC CHARGE TRANSFER BETWEEN SUCCESSIVE STAGES

[75] Inventor: Yasuhito Ichimura, Kasam, Japan

[73] Assignee: Texas Instruments Incorporated, Dallas, Tex.

[21] Appl. No.: 521,793

[22] Filed: May 10, 1990

[30] Foreign Application Priority Data

Jun. 9, 1989 [JP] Japan .................................. 1-147493

[51] Int. Cl.[5] .......................... H03K 3/01; H03K 5/13; G11C 11/00; H03L 5/00

[52] U.S. Cl. ................. 307/296.1; 307/296.5; 307/269; 307/264

[58] Field of Search ............... 307/296.1, 296.5, 296.6, 307/269, 264; 365/226; 377/57, 58

[56] References Cited

U.S. PATENT DOCUMENTS 4,970,409  11/1990  Wada et al. ...................... 307/296.1

FOREIGN PATENT DOCUMENTS 0152651  8/1985  European Pat. Off. .
0164868  12/1985  European Pat. Off. .
0323156  7/1989  European Pat. Off. .
2001494  1/1979  United Kingdom ............. 307/296.2

OTHER PUBLICATIONS

Heller, "Bucket-Brigade Delay Line With Loss Compensation", IBM Technical Disclosure Bulletin, vol. 13, No. 12, May 1971, pp. 3734–3735.

Primary Examiner—Stanley D. Miller
Assistant Examiner—Trong Phan
Attorney, Agent, or Firm—William E. Hiller; Richard L. Donaldson

[57] ABSTRACT

Electric charge transmit elements (QD) transmit electric charge from a terminal side (NA) to a control electrode side (NB) of the circuit. The voltage at the control electrode side (NB) is raised by a capacitor configuration (CB). Voltage stabilizing elements (QC) are connected in parallel to the electric charge transmit elements between the terminal side and the control electrode side. In transferring the electric charge from the control electrode side (NB) to the other terminal side (NC), the voltage at the control electrode side (NB) is kept higher than the other terminal side (NC). Therefore, because loss of voltage by the electric charge transfer elements (QB) in transferring the electric charge is eliminated, a predetermined voltage is obtained efficiently in a short time, and a highly reliable booster circuit is provided.

8 Claims, 6 Drawing Sheets

5,140,182

PLURAL STAGE VOLTAGE BOOSTER CIRCUIT WITH EFFICIENT ELECTRIC CHARGE TRANSFER BETWEEN SUCCESSIVE STAGES

BACKGROUND OF THE INVENTION

1. Field of the Invention

This invention relates to booster circuits.

2. Description of the Art

EEPROMs (electrically erasable and programmable read only memorys) are commonly known, for example, as semiconductor memories, but these memories generally require high voltage in writing and erasing.

Among EEPROMs which are generally currently used, a type which is mainly used includes a booster circuit (charge pump) to generate required high voltage within its elements.

The circuit shown in FIG. 11 has been commonly used as such booster circuit (see p. 857, IEEE JOURNAL OF SOLID-STATE CIRCUITS, VOL. SC-21, NO. 5, Oct. 1986; and p. 150, NIKKEI ELECTRONICS, 1985. Oct. 21).

As shown in the figure, the circuit is structured with a two phase clock system using N channel MOS transistors (enhancement types are being used in this case, and also in each following example) and condensers; a supply voltage ($V_{DD}$) is respectively connected to the drain and gate of an N channel MOS transistor QP1; and the source of the transistor QP1 is respectively connected to the drain and gate of an N channel MOS transistor QT1.

Similarly, N channel MOS transistors QT2-QT5 are each connected in series between the supply voltage ($V_{DD}$) and a high voltage output ($V_{PP}$) (five N channel MOS transistors are each connected in series in this case); the drain and gate of each transistor QT1, QT3 and QT5 are respectively connected to a clock input $\phi1$ through a condenser C1; and the drain and gate of each transistor QT2 and QT4 are respectively connected to a clock input $\phi2$ through a condenser C2.

In the booster circuit above, electric charge supplied from the supply voltage ($V_{DD}$) through the transistor QP1 is amplified at the same time as it is shifted to the output ($V_{PP}$) through each transistor QT1-QT5, by the clocks $\phi1$ and $\phi2$, as shown in FIG. 12.

Attention should now be paid to a problem of the above booster circuit with regard to the electric charge transfer of the N channel MOS transistor QT1 in FIG. 11. By defining the voltage of the clocks as Vc, capacity of each condenser as C, threshold voltage of the transistor QT1 as Vt (this also applies to the transistors QP1 and QT2-QT5), voltages of each of nodes N1 (the drain of the transistor QT1) and N2 (the source of the transistor QT1) before transferring the electric charge as V1 and V2, and voltage of node N2 after transferring the electric charge as Vx, then the amount of the electric charge at nodes N1 and N2 before and after transferring the electric charge can be represented as follows:

$$C(V1+Vc)+CV2=C(Vx+Vt)+VxC$$

Therefore, the voltage Vx of node N2 after transferring the electric charge is:

$$Vx=\tfrac{1}{2}(V1+V2+Vc-Vt)$$

As can be seen from the above formula, in the booster circuit in FIG. 11, because the drain and the gate of the transistor QT1 are connected to each other (used as one-directional elements like a diode by shorting the gate and the drain) the voltage Vx of node N2 after transferring the electric charge inevitably takes a value lower than the transistor QT1 by the threshold voltage Vt (that is, a loss by the threshold voltage Vt appears, inevitably).

Voltages which each node N1–N5 in FIG. 11 reaches are as follows:

$$N1: V1_{max} = (V_{DD} - Vt) + Vc$$
$$N2: V2_{max} = (V1_{max} - Vt) + Vc$$
$$= (V_{DD} - 2Vt) + 2Vc$$
$$N3: V3_{max} = (V2_{max} - Vt) + Vc$$
$$= (V_{DD} - 3Vt) + 3Vc$$
$$N4: V4_{max} = (V3_{max} - Vt) + Vc$$
$$= (V_{DD} - 4Vt) + 4Vc$$
$$N5: V5_{max} = (V4_{max} - Vt) + Vc$$
$$= (V_{DD} - 5Vt) + 5Vc$$

Therefore, as can be seen from each of the above formulae, the more the number of steps, such as the transistors QT1–QT4, the greater the loss by their threshold voltages Vt in transferring the electric charge (in this case, there is finally a voltage loss of 5Vt including the threshold voltage Vt of the transistor QP1); thus, the transfer efficiency of the electric charge significantly deteriorates (that is, too much time is taken to obtain a desired output voltage $V_{PP}$). If the required output voltage $V_{PP}$ is high, the numbers of steps of the transistors QT1–QT5 must be naturally increased; thus, the transfer efficiency of the electric charge further deteriorates.

Also, in the case of mass production, in device fabrication, fabrication processes inevitably vary. Therefore, the values of each threshold voltage, Vt, of the transistors QP1 and QT1–QT4 or the like also vary; as a result, the value of the output voltage $V_{PP}$ is not stable. This degrades the reliability of the booster circuit.

In the above booster circuit, a circuit structure, shown in FIG. 13, in which elements similar to the N channel MOS transistor QP1 (transistors QP2–QP5) are connected to each node N2–N5 for supplying the supply voltage $V_{DD}$, may be also possible, but still each problem described above cannot be solved. From actually examining a change of the high voltage output $V_{PP}$ of the booster circuit with the above circuit structure, it can be seen that the graph b in FIG. 4 shows worse booster efficiency of the output voltage $V_{PP}$ (too much time is taken to obtain the same voltage), compared with the graph a of a later described embodiment of the present invention (a later described embodiment of FIG. 1).

SUMMARY OF THE INVENTION

A purpose of the invention is to provide highly reliable booster circuits which can obtain desired voltage efficiently in a short time.

This invention relates to such booster circuits which have electric charge transfer elements (for example, later described N channel MOS transistors QB) for transferring electric charge at one terminal side to the other terminal side so as to raise the voltage at the above other terminal side, wherein supply voltage selective supply elements (for example, later described N channel MOS transistors QA) and first electric charge supply elements (for example, later described condensers CA) are connected in parallel to the above one terminal side of the electric charge transfer elements (for example, later described N channel MOS transistors QB), wherein second electric charge supply elements (for example, later described condensers CB) are connected to control electrodes of the above electric charge transfer elements (for example, later described N channel MOS transistors QB), wherein electric charge transmit elements (for example, later described N channel MOS transistors QD) which transmit the electric charge from the above one terminal side to the above control electrode side and voltage stabilizing elements (for example, later described N channel MOS transistors QC) which stabilize voltage at the above control electrodes are connected in parallel between the above one terminal side of the above first electric supply elements (for example, later described condensers CA) and the above control electrode side of the above second electric charge supply elements (for example, later described condensers CB).

Also, this invention is to supply such booster circuits which have electric charge transfer elements (for example, later described N channel MOS transistors QB) for transferring electric charge at one terminal side to the other terminal side so as to raise voltage at the above other terminal side, wherein supply voltage selective supply elements (for example, later described N channel MOS transistors QA) and first electric charge supply elements (for example, later described condensers CA) are connected in parallel to the above one terminal side of the electric charge transfer elements, wherein second electric charge supply elements (for example, later described condensers CB) are connected to control electrodes of the above electric charge transfer elements, wherein electric charge transmit elements (for example, later described N channel MOS transistors QD) which transmit the electric charge form the above one terminal side to the above control electrode side are connected between the above one terminal side of the above first electric supply elements and the above control electrode side of the above second electric charge supply elements.

BRIEF DESCRIPTION OF THE DRAWINGS

FIG. 1 is an equivalent circuit diagram showing an embodiment of a booster circuit of the invention;

FIG. 2 is a timing chart showing clock input waveforms of FIG. 1;

FIG. 3 is an actual timing chart showing the clock input waveforms and voltage changes of each node of FIG. 1;

FIG. 4 shows voltage-time characteristic showing a change of high voltage output of FIG. 1;

FIG. 5 is a block diagram showing an embodiment in which the booster circuit of the invention in FIG. 1 is applied to an EEPROM;

FIG. 6 is a schematic block diagram of main parts to illustrate a flow of the high voltage output from the booster circuit in FIG. 5;

FIG. 7 is a theoretical circuit diagram to control the high voltage output of the booster circuit in FIG. 6;

FIG. 8 is a cross-sectional view of a memory cell in FIG. 6;

FIG. 9 is a plan view of FIG. 8 (FIG. 8 being taken along VIII—VIII of FIG. 9); and FIG. 10 is an equivalent circuit diagram showing a booster circuit of another embodiment of the invention.

FIG. 11 is an equivalent circuit diagram showing a prior booster circuit;

FIG. 12 is a timing chart showing clock input waveforms of FIG. 11; and

FIG. 13 is an equivalent circuit diagram showing a booster circuit of a circuit structure similar to the prior embodiment of FIG. 11.

In reference numerals shown in the figures:

Figure 1:
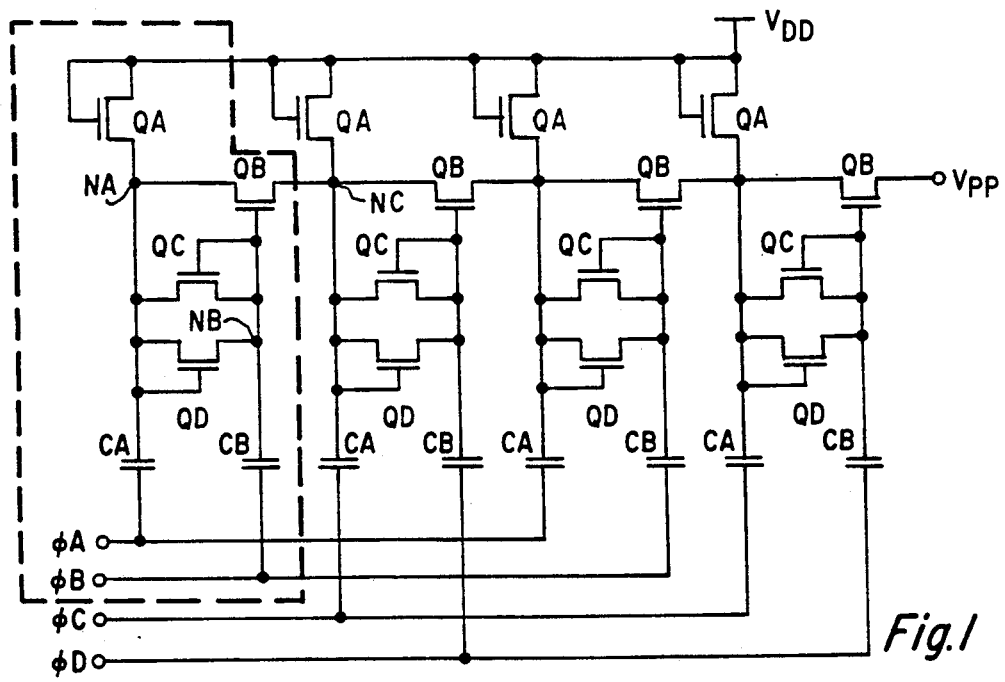
FIGS. 1-10 show embodiments of the invention.

| | |
|---|---|
| QA, QB, QC, QD, QP1, QP2, QP3, QP4, QP5, QT1, QT2, QT3, QT4, QT5 | N channel MOS transistors; |
| CA, CB, C1, C2 | condensers; |
| NA, NC | one terminal side or the other terminal side; |
| NB | control electrode; |
| N1, N2, N3, N4, N5 | one terminal side, or the other terminal side, or control electrodes; |
| $\phi A, \phi B, \phi C, \phi D, \phi 1, \phi 2$ | clock inputs; |
| $V_{DD}$ | supply voltage; |
| $V_{SS}$ | ground voltage (GND); |
| $V_{PP}$ | high voltage output. |

DESCRIPTION OF THE PREFERRED EMBODIMENTS

Hereinafter, embodiments of the invention will be described.

FIGS. 1-9 show an embodiment in which the invention is applied to an EEPROM.

First, a memory cell of the EEPROM will be described in FIGS. 8 and 9, and sectional view hatching is omitted in FIG. 8 to facilitate understanding. In the memory cell shown in FIG. 8, an N+ type source region 2, an N+ type drain region 3, and an N+ type semiconductor region (bit line) 4 are formed in a P− type silicon substrate 1; over these regions, a floating gate 6 and a control gate 7 of polysilicon are piled with a SiO$_2$ film (a gate insulating film) 5 therebetween, to constitute an N channel storage transistor Tr$_1$, and a selective word line 8 of polysilicon is formed to constitute an N channel selection transistor Tr$_2$. A part of the gate insulating film 5 is made 100–150 Å thick to be a tunnel region 9 where electrical charge can be transferred by Fowler-Nordheim (F-N) tunneling. A diffusion layer 3 with high impurity concentration is formed under this thin film part 10, and a high electric field may be applied to the thin film part 10 by applying a voltage between the layer 3 and the floating gate 6. The control gate 7 and the floating gate 6 are electrically insulated by an insulating film (generally, a SiO$_2$ film) 11.

In the above memory cell, data of a program can be divided into "erase" and "write".

First, in the case of an N channel, high voltage is applied to the control gate 7 to erase data in the cell. Then, the drain 3 of the N channel storage transistor Tr$_1$ has become 0 V through the N channel selection transistor Tr$_2$; electric potential of the floating gate 6 is raised by capacitive coupling Cc between the floating gate 6 and the control 7; and a high electric field (for example, up to 10 MV/cm) is applied to the thin film part 10. This electric field generates F-N tunneling at the thin film part, causing the floating gate 6 to have excess electrons (the cell being in a state of non-conduction).

Next, in order to write data in the cell, the control gate 7 is kept 0 V, and a high voltage is applied to the drain 3 of the N channel storage transistor $Tr_1$ through the N channel selection transistor $Tr_2$. High electric field of the opposite direction from the above erase case is applied to the thin film part 10; the floating gate 6 is caused to have excess holes by the F-N tunneling (the cell being in a state of conduction).

Writing and erasing of memory cells in the above EEPROM can be realized by injecting electrons or holes into the floating gate 6. The injection of electrons or holes causes the tunnel phenomenon in a narrowed part of the oxide film 5 (the part shown by the tunnel region 9 or the thin film part 10 in FIG. 8) to make tunnel current flow there, which realizes the writing and erasing. For example, in the case of an N channel, writing can be performed by injecting holes, and information can be erased by injecting electrons. In the case of a P channel, the operation is opposite thereto.

The tunnel current is a function of strength of the electric field applied to the thin oxide film 10, thus being a function of the electric potential ($V_F$) of the floating gate. If the tunnel current ($I_{FN}$) is to be entirely Fowler-Nordheim tunnel current, the below formula can be obtained:

$$I_{FN} = aV_F^2 \exp(-b/V_F)$$

where, the larger $V_F$ becomes, the more current flows. Data writing time is inversely proportional to the tunnel current. Thus, if $V_F$ can be made larger, the data writing time may be shortened. Generally, to obtain high integration of memory elements, the electric potential of the floating gate is not provided from the outside, but is provided by the capacity ratio, keeping the electric potential of the control gate high. In FIG. 8, with the capacity between the substrate 1 and the floating gate 6 being $C_F$, the capacity between the floating gate 6 and the control gate 7 being $C_C$, the substrate electric potential being 0, and the electric potential of the control gate being $V_G$, $V_F$ is given by the below formula:

$$|V_F| = \frac{C_C}{C_C + C_F} \cdot |V_G|$$

$C_F$ takes larger value compared to $C_C$ also because of the thin tunnel region 10 of the thin oxide film 5, and thus $V_F$ is one half of $V_G$, or less. Therefore, to shorten the writing time or the like, high voltage has to be applied during the writing time or the like, and the method to place a voltage booster circuit inside, as described above, is usually taken.

Figure 8:
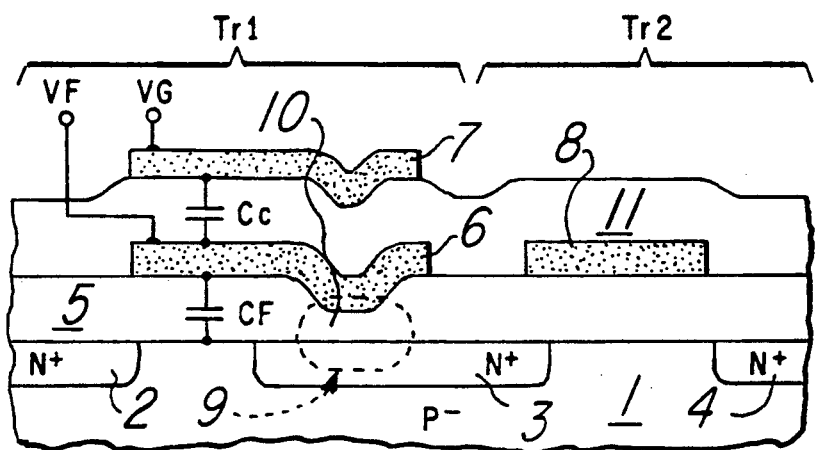
Figure 9:
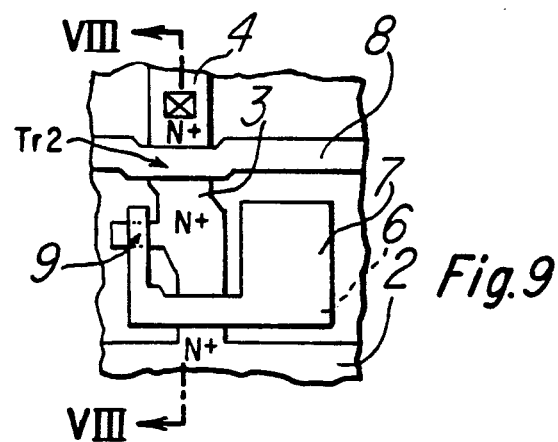

FIG. 9 is a plan view of FIG. 8.

Figure 5:
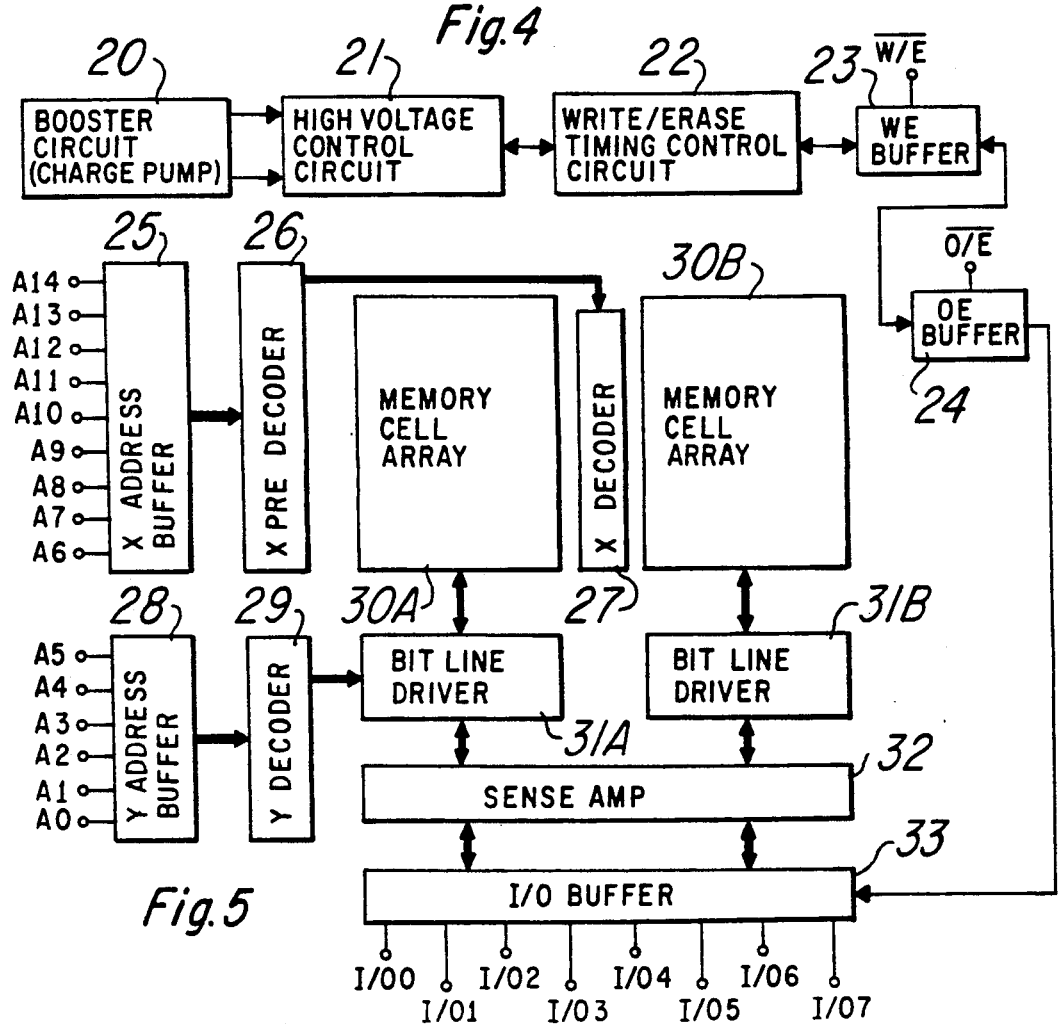
Figure 6:
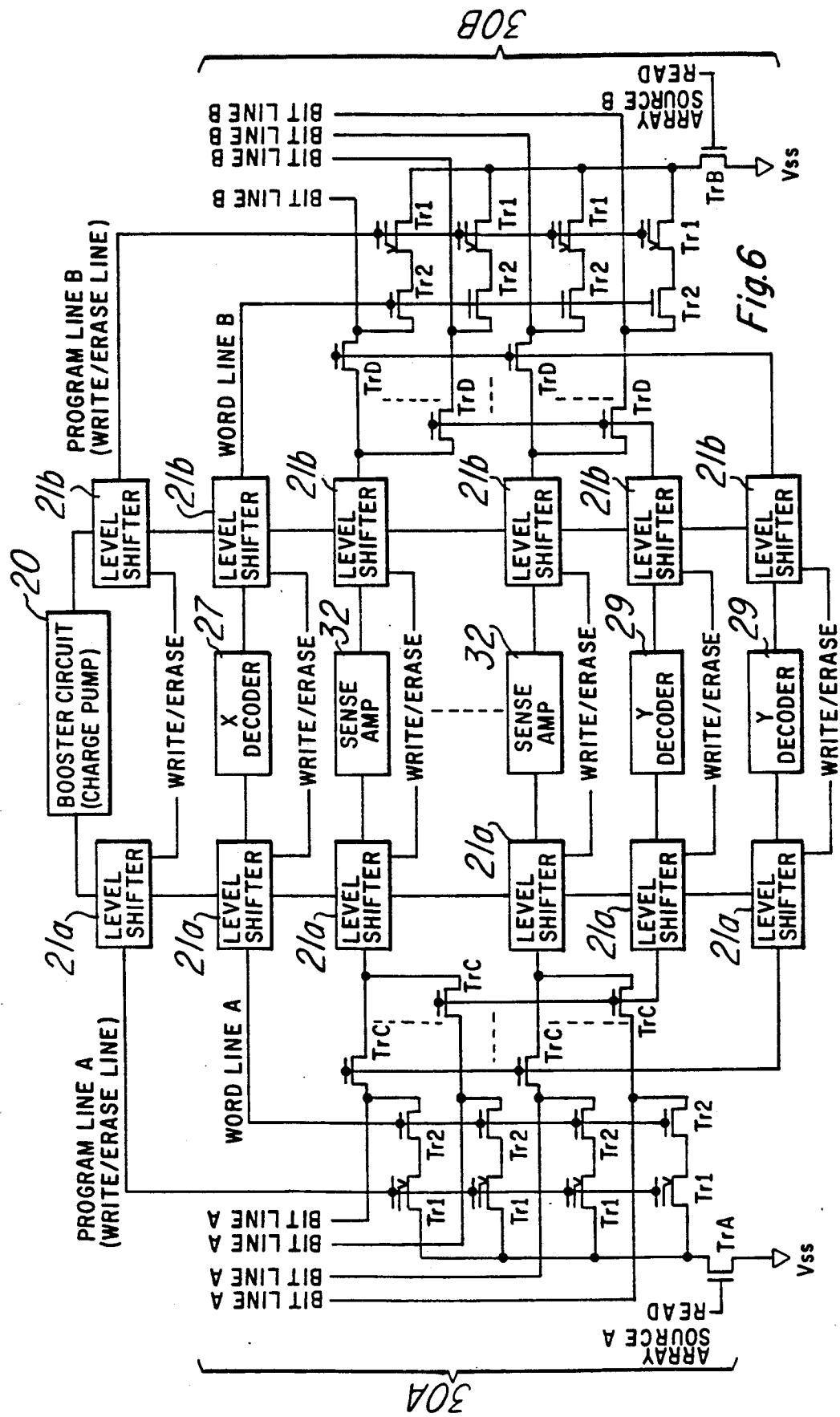
Figure 7:
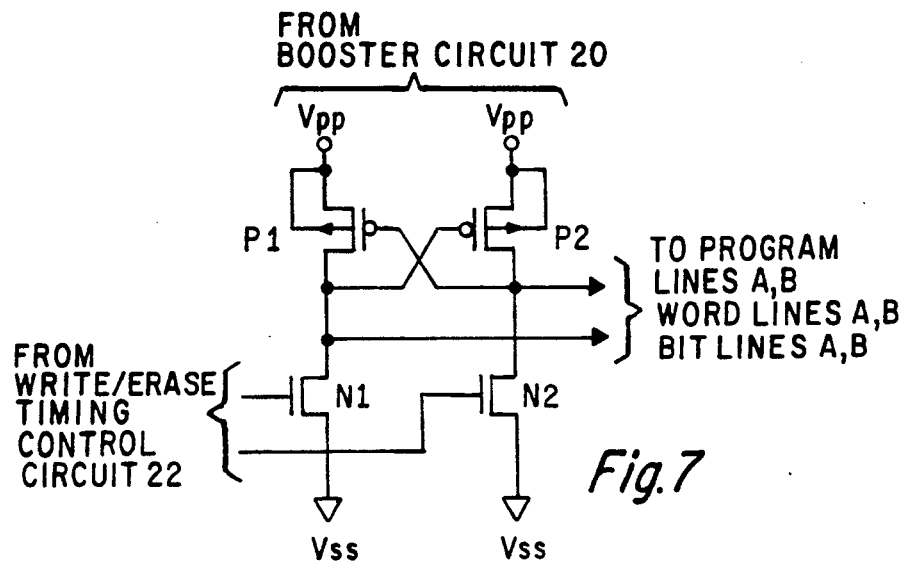

With regard to FIGS. 5-7, below is a brief description of the operation in a flow of high voltage output $V_{PP}$ supplied from a booster circuit 20 in the above described EEPROM write and erase. FIG. 5 is a block diagram showing an example of an EEPROM; FIGS. 6 and 7 are block diagram and circuit diagram respectively to illustrate the basic operation of the high voltage output $V_{PP}$ being supplied in writing and erasing the EEPROM. In FIG. 6, an X decoder 27 and level shifters 21a and 21b (a part of the high voltage control circuit 21 in FIG. 5, should be taken as the same in the following description), a sense amp 32 and level shifters 21a and 21b, a Y decoder 29 and level shifters 21a and 21b are respectively structured as one body in fact, but they are each described as a separate structure for the convenience of description.

As shown in FIG. 6, a plurality of bit lines A and B are connected to each sense amp 32 (for example, eight bit lines to one sense amp); each above described storage transistor $Tr_1$ and each selection transistor $Tr_2$ constitute memory cell matrices 30A and 30B respectively. The X decoder outputs (word lines) A and B are connected to the gates of each selection transistor, and the bit lines A and B are each connected to the drains of each selection transistor. The control gates are structured to be controlled by the address unit. In operation, if selected cells are erased, current does not flow into the storage transistors. On the other hand, if selected cells are written, current flows into the transistors. By detecting this current, a "1" or "0" can be outputted.

Also, one bit line A or B among each bit line A or B is selected by the Y decoder 29 through each transistor $Tr_C$ or $Tr_D$ (for example, one bit line among eight bit lines A or B); one of the above memory cells connected to the selected bit line A or B is structured to be selected by each word line A or B connected to the X decoder 27 (see FIG. 5).

With regard to the flow of the high voltage output $V_{PP}$ from the booster circuit 20 in each of the above structures, as seen in FIG. 6, the high voltage output $V_{PP}$ outputted from the booster circuit 20 is supplied through each level shifter 21a and 21b to program lines (write/erase lines) A and B, word lines A and B, bit lines A and B, or the like. The above level shifters 21a and 21b are a part of the high voltage control circuit 21 in FIG. 5 and are, in principle, structured with the circuit shown in FIG. 7. That is, as can be seen in the figure, the circuit is structured with two P channel MOS transistors P1 and P2 and two N channel MOS transistors N1 and N2, to supply a given voltage to program lines A and B, word lines A and B, and bit lines A and B, respectively, by controlling the high voltage outputs $V_{PP}$-$V_{SS}$ by general input signals (supply voltage $V_{DD}$-ground voltage $V_{SS}$) from a timing control circuit 22.

Thus, first in writing, with a signal from the write/erase timing control circuit 22 in FIG. 5 being inputted to each of the above level shifters 21a and 21b, the high voltage output $V_{PP}$ is outputted to a program line A or B and a word line A or B, and the ground voltage $V_{SS}$ is outputted to a bit line A or B, to write data "1" in a selected memory cell.

Next, in erasing, as in writing above described, the ground voltage $V_{SS}$ is outputted to a program line A or B, and the high voltage output $V_{PP}$ is respectively outputted to a word line A or B and a bit line A or B, to write data "0" in a selected memory cell (that is, to erase the data).

Details of the data reading operation will be omitted here, but in reading, for example, with the program line A or B being 2 V (this voltage should be lower than the threshold voltage of the transistor $Tr_1$ in which data is written, and should be higher than the threshold voltage of the transistor $Tr_1$ in which data is not written.), by connecting the word line A or B to $V_{DD}$, and connecting an array source A or B in FIG. 6 to the ground voltage $V_{SS}$ through a transistor $Tr_A$ or $Tr_B$, data in the selected memory cell can be read through a bit line A or B. In writing, for example in the case of writing data in a selected memory cell, in order not to write data in other unselected cells connected to the same program line A or B, the bit lines A or B connected with the above unselected memory cells are connected to $V_{PP}$; therefore, the high voltage output $V_{PP}$ is connected to the word line A or B in the above writing or erasing. In erasing, for example, in the case of erasing data in a selected memory cell, a bit line A or B is connected to $V_{PP}$, and a word line A or B is connected to $V_{PP}$ to transfer the high voltage.

In the writing above described, for example, in the case of writing data into a selected memory cell, memory cells which are not written are conductive and will short $V_{PP}$ and $V_{SS}$ unless memory cells are floating; thus, the above array source A or B is in the floating state in writing and erasing. Also in erasing, for example, in the case of erasing data in a selected memory cell, a bit line A or B is connected to $V_{PP}$. This is because $V_{PP}$ and $V_{SS}$ will be shorted unless the selected memory cells are floating because they are conductive, even if the program line A or B is $V_{SS}$, after the erasing of the data.

In FIG. 5, reference number 23 is a WE buffer; 24 is an OE Buffer; 25 is an X address buffer; 26 is an X predecoder; 28 is a Y address buffer; 31A and 31B are bit line drivers respectively; and 33 is an I/O buffer.

Next, the above described booster circuit 20 will be described with regard to FIG. 1. The booster circuit 20 of the invention is structured with a four phase clock system, with the circuit structure of the broken lines in the figure being one repeated unit (four stages in this embodiment). The same reference signals are used for each element in the figure for the convenience of description.

First, with regard to the one circuit structure unit shown in the broken lines, a supply voltage ($V_{DD}$) is connected to the drain and gate of an N channel MOS transistor QA respectively, and its source is connected to the drain of an N channel MOS transistor QB. The source of the transistor QA and the drain of the transistor QB are respectively connected through a condenser CA to a clock input $\phi A$; the gate of the transistor QB is connected through a condenser CB to a clock input $\phi B$. Furthermore, the source of an N channel MOS transistor QC, and the drain and gate of an N channel MOS transistor QD are respectively connected to the source of the transistor QA and the drain of the transistor QB; the drain and gate of the transistor QC and the source of the transistor QD are respectively connected to the gate of the transistor QB.

The same circuit structure is repeated in the second stage and on. That is, with regard to each transistor QB, the source of a former transistor QB is connected to the drain of a following transistor QB; the source of the last transistor QB (in this case, the fourth transistor QB) is connected to the output voltage $V_{PP}$. As in the above, clock inputs are connected to each stage by combinations of $\phi A$ and $\phi B$, and $\phi C$ and $\phi D$, in turn.

Next, with regard to FIG. 2, the one circuit structure unit shown in the broken lines in FIG. 1 with the function of each element will be described.

With regard to the function of each element, the transistor QA is to supply electric charge from the supply voltage $V_{DD}$ to a node NA; the transistor QB is to transfer the electric charge from node NA to a node NC; the transistor QC is to transfer excess electric charge in node NB to node NA; the transistor QD is to supply the electric charge from node NA to node NB; the condenser CA is to raise electric potential of node NA by the clock $\phi A$ (in other words, to supply the electric charge to node NA); and the condenser CB is to raise electric potential of node NB by the clock $\phi B$ (in other words, to supply the electric charge to node NB) to turn the electric charge transfer transistor QB on and off.

In operation, in the initial stage, electric charge is supplied from $V_{DD}$ to node NA by the transistor QA; the electric charge is supplied from node NA to node NB by the transistor QD. Next, the $\phi A$ rises, and the electric potential of node NA, which is capacity coupled by the condenser CA, rises. At this time, the electric potential of node NB is also raised by the transistor QD. Next, $\phi B$ rises, and the electric potential of node NB is raised by the condenser CB as described above. Then, the transistor QB turns on to transfer the electric charge from node NA to node NC. At this time, because the transistor QC turns on, node NB is stabilized at a voltage higher than node NA by the threshold voltage Vt of the transistor QC.

Generally, in order to make an N channel MOS transistor conductive, the gate voltage must be higher than the source voltage by the threshold voltage of the transistor and over; also in order to make the source voltage of the transistor the same as drain voltage, the gate voltage only has to be higher than the source voltage at least by the threshold voltage of the transistor (that is, the gate voltage only has to be higher than the drain voltage by the threshold voltage of the transistor and over).

Figure 2:
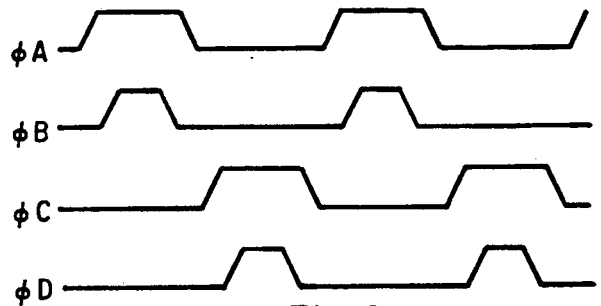

With regard to each of the transistors QA in FIG. 1, as the output voltage $V_{PP}$ approaches the maximum value, the transistors QA become non-functioning gradually from the transistor QA connected to the side of the output voltage $V_{PP}$, leaving only the first stage transistor QA functioning; however, the transfer efficiency of the electric charge improves because nodes are previously pulled up by the electric charge supplied to each of the nodes (each of the sources of the transistors QA) from the supply voltage ($V_{DD}$), in the first stage.

Figure 3:
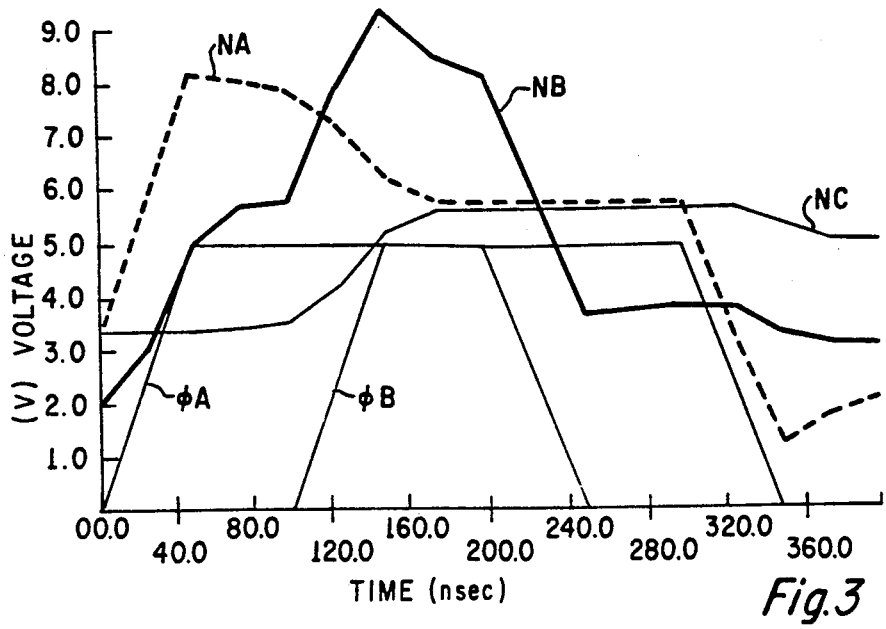
Figure 4:
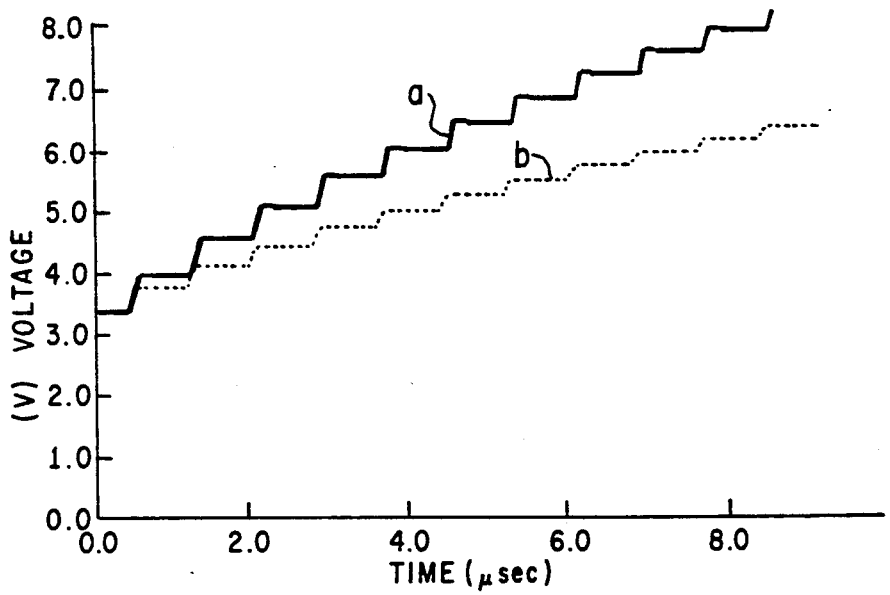

FIG. 3 is an actual timing chart of each of nodes NA, NB, and NC, and the clock inputs $\phi A$ and $\phi B$ in FIG. 1; FIG. 4 shows the voltage-time characteristic showing the rise of the high voltage output $V_{PP}$ in the booster circuit 20 of FIG. 1.

As described above, according to the booster circuit of this embodiment, supply voltage selective supply elements (in this case, an N channel MOS transistors QA) and first electric charge supply elements (in this case, condensers CA) are connected in parallel to one terminal (in this case, nodes NA: drains of N channel MOS transistors QB) of electric charge transfer elements (in this case, the N channel MOS transistors QB) which are to raise voltage at the other terminal side (in this case, nodes NC: sources of the N channel MOS transistors QB) by transferring electric charge from the above described one terminal side to the above described other terminal side; second electric charge supply elements (in this case, condensers CB) are connected to control electrodes (in this case, nodes NB: gates of the N channel MOS transistors QB) of the above electric charge transfer elements (in this case, the N channel MOS transistors QB); electric charge transmit elements (in this case, N channel MOS transistors QD) which transmit the electric charge from the above one terminal side (in this case, nodes NA: the drains of the N channel MOS transistors QB) to the above control electrode side (in this case, nodes NB: the gates of the N channel NOS transistors QB), and voltage stabilizing elements (in this case, N channel MOS transistors QC) which are to stabilize voltage of the above control electrodes (in this case, the nodes NB: the gates of the N channel MOS transistors QB) are connected in parallel, between the above one terminal side (in this case, nodes NA: the drains of the N channel MOS transistors QB) of the above first electric charge supply elements (in this case, the condensers CA), and the above control electrode side (in this case, nodes NB: the gates of the N channel MOS transistors QB) of the above second electric charge supply elements (in this case, the condensers CB); therefore, in transferring the electric charge by the above electric charge transfer elements (the N channel MOS transistors QB), first, voltage at the one terminal side (in this case, nodes NA) is raised by the above first electric charge supply elements (in this case, the condensers CA); further, voltage at the above control electrode side (in this case, nodes NB) is raised by the above second electric charge supply elements (in this case, the condensers CB) and the above electric charge transmit element (in this case, the N channel MOS transistors QD); and then, the voltage can be raised higher by the threshold voltage Vt of the voltage stabilizing elements (the N channel MOS transistors QC) than the above other terminal side (in this case, nodes NC) (that is, the voltage can be raised higher by the threshold voltage Vt of the transistor QB).

Figure 11:
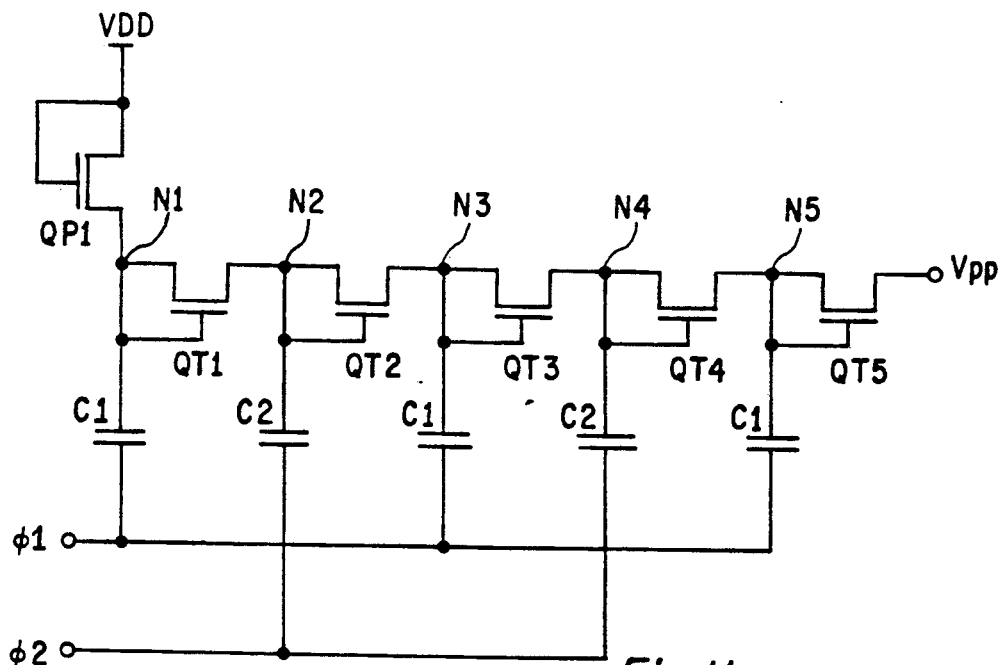
FIGS. 11-13 show prior art.
Figure 12:
Figure 12:
Figure 13:
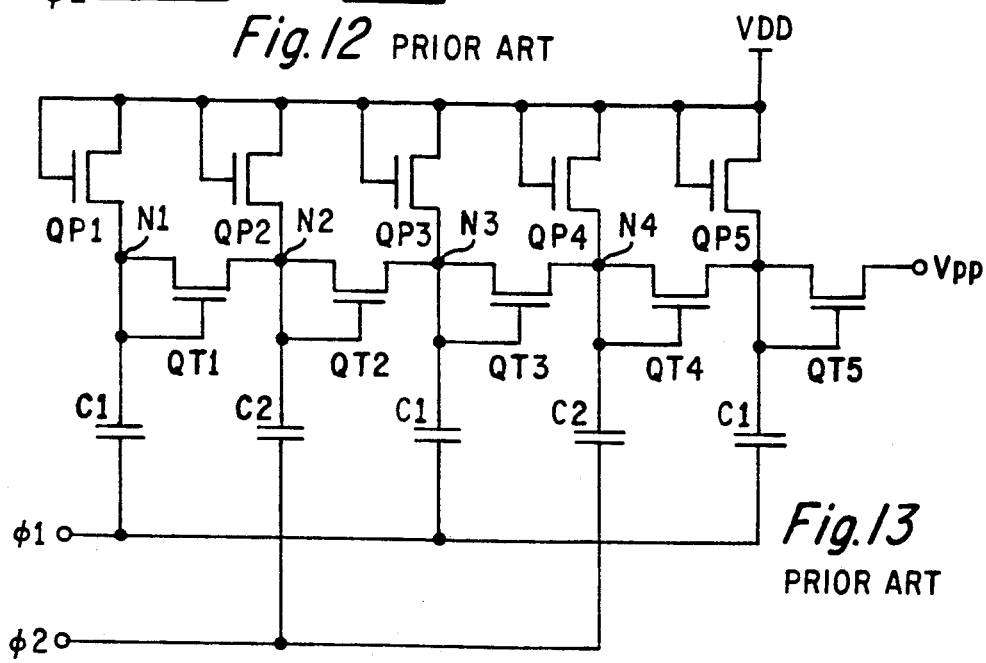

Therefore, as in the above FIG. 11, in transferring the electric charge, loss of the voltage by the threshold voltage Vt of the transistor QT1 or the like may be eliminated. As a result, as shown in FIG. 1, in the case of actually structuring a circuit with four stages in total with the circuit shown in the broken lines being as one unit, the rise time of the high voltage output $V_{PP}$ can be seen to be very fast, compared with the graph b, as shown in the graph a in FIG. 4. Thus, it can be understood that a desired high voltage output $V_{PP}$ can be realized very efficiently and in a very short time.

Generally, the values of the threshold voltage Vt of each of the above described transistors or the like inevitably differ in the fabrication of devices (due to uneven fabrication processes in mass production); as a result, the value of the high voltage output $V_{PP}$ varies. However, as described in the above, the booster circuits of the invention can eliminate the loss of the voltage by the threshold voltage Vt of the transistors or the like in transferring the electric charge, so that highly reliable booster circuits may be provided without varying the value of the high voltage output $V_{PP}$.

Figure 10:
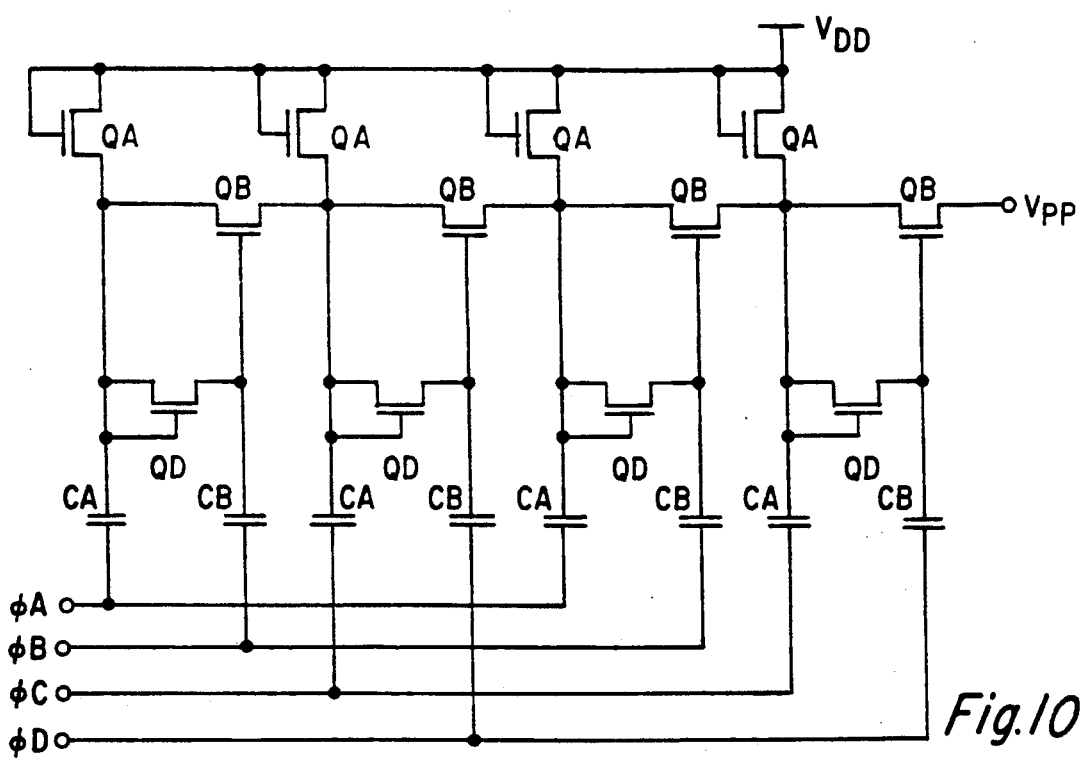

FIG. 10 shows another embodiment of the invention, and its basic circuit structure is almost the same as that of the embodiment in FIG. 1. The difference from the embodiment in FIG. 1 is that an N channel MOS transistor QC, which is a voltage stabilizing element, is not connected.

Thus, this embodiment also has the same advantages respectively as in the above described embodiment. In this embodiment, for example, by optimizing clock inputs $\phi B$ and $\phi D$, a high voltage output $V_{PP}$ may be easily controlled.

Although the invention has been illustrated hereinabove with embodiments, the above embodiments may be further modified based on the technical idea of the invention.

For example, although N channel MOS transistors or the like are used for each element in the above embodiments, P channel MOS transistors, bipolar transistors, diodes or the like also may be appropriately used. Also, elements other than the ones described above may be connected in appropriate places.

Although a four phase clock system or a two phase clock system is used in the above described embodiments, a six phase clock system or an eight phase clock system also may be appropriately used.

The invention may be also applied, for example, to line drivers or the like, besides to the above described EEPROM.

EFFECTS OF THE INVENTION

In this invention, as described in the above, between one terminal side (for example, the above nodes NA) of first electric charge supply elements (for example, the above condensers CA) and a control electrode side (for example, the above gates of the transistors QB) of electric charge transfer elements (for example, the above transistors QB) of second electric supply elements (for example, the condensers CB), electric charge transmit elements (for example, the above transistors QD), which transmit electric charge from the above one terminal side to the above control electrode side, are connected; therefore, voltage at the above control electrode side can be raised by the above first electric charge elements, the above second electric charge supply elements, and the above electric charge transmit elements. Also, between the above one terminal side and the above control electrode side, voltage stabilizing elements which stabilize the voltage at the control electrode side are connected in parallel to the above electric charge transmit elements; thus, in transferring the electric charge at the above control electrode side to the other terminal side (for example, the above nodes NC) by the above electric charge transfer elements, the voltage at the above control electrode side can be kept higher than the above other terminal side (for example, as in the above, the voltage can be kept higher by the threshold voltage Vt of the N channel MOS transistors QB which are electric charge transfer elements). Therefore, because loss of the voltage by the above electric charge transfer elements in transferring the above electric charge can be eliminated, predetermined voltage can be obtained efficiently in a short time, and highly reliable booster circuits can be provided.

Also in the invention, as described in the above, between one terminal side (for example, the above nodes NA) of first electric charge supply elements (for example, the above condensers CA) and a control electrode side (for example, the above gates of the transistors QB) of electric charge transfer elements (for example, the above transistors QB) of second electric charge supply elements (for example, the condensers CB), electric charge transmit elements (for example, the above transistors QD) which transmit electric charge from the above one terminal side to the above control electrode side, are connected; therefore, in transferring the electric charge at the above one terminal side to the other terminal side (for example, the above nodes NC) by the above electric charge transfer elements, voltage at the above control electrode side can be raised higher than the above other terminal side by the above first electric charge supply elements, the above second electric charge supply elements, and the above electric charge transmit elements. Thus, as in the above, loss of the voltage by transferring the electric charge can be eliminated.

What is claimed is:

1. A voltage booster circuit for use in a non-volatile semiconductor memory, said voltage booster circuit comprising:
    an electric charge supply element having one terminal side for connection to a power source voltage terminal;
    an electric charge transfer element having one terminal side connected to the other terminal side of said electric charge supply element;
    a first node disposed in the connection between the other terminal side of said electric charge supply element and the one terminal side of said electric charge transfer element;
    a first capacitor connected at one end to said first node;
    the electric potential of said first node rising in response to the application of a first clock signal to the other end of said first capacitor;
    a second electric charge supply element having one terminal side connected between said first node and said first capacitor;
    said electric charge transfer element having control means between the one terminal side and the other terminal side thereof;
    an output terminal connected to the other terminal side of said electric charge transfer element;
    a second node connected to said control means of said electric charge transfer element;
    a second capacitor connected at one end to said second node;
    the other terminal side of said second electric charge supply element being connected to said second node between said control means of said electric charge transfer element and said second capacitor;
    the electric potential of said second node rising in response to the application of a second clock signal to the other end of said second capacitor; and
    the increased electric potential of said second node being communicated to said control means of said electric charge transfer element to render said electric charge transfer element conductive for transferring electric potential from said first node to said output terminal at an increased voltage magnitude.

2. A voltage booster circuit as set forth in claim 1, further including a second electric charge transfer element having one terminal side connected between said first node and said first capacitor and the other terminal side connected between said control means of the first-mentioned said electric charge transfer element and said second capacitor; and
    said second electric charge transfer element having control means between the one terminal side and the other terminal side thereof and being rendered conductive in response to the increased electric potential of said second node communicated to said control means of said first-mentioned electric charge transfer element and to said control means of said second electric charge transfer element for stabilizing said second node at an electric potential higher than the electric potential of said first node.

3. A voltage booster circuit as set forth in claim 1, wherein said electric charge supply elements and said electric charge transfer element are MOS transistors having respective source and drain regions and a gate electrode; and
    said control means of said electric charge transfer element is the gate electrode of the MOS transistor which is the electric charge transfer element.

4. A voltage booster circuit for use in a non-volatile semiconductor memory, said voltage booster circuit comprising:
    a plurality of successive stages, each of said plurality of stages comprising:
        an electric charge supply element having one terminal side for connection to a power source voltage terminal,
        an electric charge transfer element having one terminal side connected to the other terminal side of said electric charge supply element,
        a first node disposed in the connection between the other terminal side of said electric charge supply element and the one terminal side of said electric charge transfer element,
        a first capacitor connected at one end to said first node,
        the electric potential of said first node rising in response to the application of a first clock signal to the other end of said first capacitor,
        a second electric charge supply element having one terminal side connected between said first node and said first capacitor,
        said electric charge transfer element having control means between the one terminal side and the other terminal side thereof,
        an output terminal connected to the other terminal side of said electric charge transfer element,
        a second node connected to said control means of said electric charge transfer element,
        a second capacitor connected at one end to said second node,
        the other terminal side of said second electric charge supply element being connected to said second node between said control means of said electric charge transfer element and said second capacitor,
        the electric potential of said second node rising in response to the application of a second clock signal to the other end of said second capacitor, and
        the increased electric potential of said second node being communicated to said control means of said electric charge transfer element to render said electric charge transfer element conductive for transferring electric potential from said first node to said output terminal at an increased voltage magnitude;
    wherein said output terminal of a first stage of said plurality of stages is the first node of the next successive stage such that the electric potential of said second nodes of the successive stages included in said plurality of stages is communicated to said control means of said electric charge transfer element of said stage corresponding thereto to render said electric charge transfer element conductive for transferring electric potential from said first node to said output terminal of the corresponding stage at an increased voltage magnitude such that the voltage magnitude is boosted to increased magnitudes as the electric potential is transferred from stage to stage to the output terminal of the last stage included in said plurality of stages.

5. A voltage booster circuit as set forth in claim 4, wherein each stage of said plurality of stages further includes a second electric charge transfer element having one terminal side connected between said first node and said first capacitor and the other terminal side connected between said control means of the first-mentioned said electric charge transfer element and said second capacitor; and said second electric charge transfer element having control means between the one terminal side and the other terminal side thereof and being rendered conductive in response to the increased electric potential of said second node communicated to said control means of said first-mentioned electric charge transfer element and to said control means of said second electric charge transfer element for stabilizing said second node at an electric potential higher than the electric potential of said first node.

6. A voltage booster circuit as set forth in claim 4, wherein said electric charge supply elements and said electric charge transfer element included in each stage of said plurality of stages are MOS transistors having respective source and drain regions and a gate electrode; and said control means of said electric charge transfer element is the gate electrode of the MOS transistor which is the electric charge transfer element.

7. A voltage booster circuit as set forth in claim 4, wherein alternate stages of said plurality of stages are operated from third and fourth clock signals as contrasted to said first and second clock signals;

the electric potential of said first node of said alternate stage rising in response to the application of said third clock signal to the other end of capacitor of said alternate stage; and the electric potential of said second node of said alternate stage rising in response to the application of said fourth clock signal to the other end of said second capacitor of said alternate stage.

8. A voltage booster circuit as set forth in claim 5, wherein alternate stages of said plurality of stages are operated from third and fourth clock signals as contrasted to said first and second clock signals;

the electric potential of said first node of said alternate stage rising in response to the application of said third clock signal to the other end of said first capacitor of said alternate stage; and the electric potential of said second node of said alternate stage rising in response to the application of said fourth clock signal to the other end of said second capacitor of said alternate stage.

* * * * *